US010790298B2

(12) United States Patent
Purayath

(10) Patent No.: US 10,790,298 B2
(45) Date of Patent: Sep. 29, 2020

(54) METHODS AND APPARATUS FOR THREE-DIMENSIONAL NAND STRUCTURE FABRICATION

(71) Applicant: APPLIED MATERIALS, INC., Santa Clara, CA (US)

(72) Inventor: Vinod Robert Purayath, Los Gatos, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/268,558

(22) Filed: Feb. 6, 2019

(65) Prior Publication Data

US 2020/0227433 A1 Jul. 16, 2020

Related U.S. Application Data

(60) Provisional application No. 62/791,262, filed on Jan. 11, 2019.

(51) Int. Cl.
| | |
|---|---|
| *H01L 21/02* | (2006.01) |
| *H01L 27/11582* | (2017.01) |
| *H01L 27/1157* | (2017.01) |
| *H01L 21/67* | (2006.01) |
| *H01L 21/311* | (2006.01) |
| *H01L 21/28* | (2006.01) |

(52) U.S. Cl.
CPC .... *H01L 27/11582* (2013.01); *H01L 21/0228* (2013.01); *H01L 21/02238* (2013.01); *H01L 21/31116* (2013.01); *H01L 21/67069* (2013.01); *H01L 27/1157* (2013.01); *H01L 29/40117* (2019.08)

(58) Field of Classification Search
None
See application file for complete search history.

(56) References Cited

U.S. PATENT DOCUMENTS

| | | | |
|---|---|---|---|
| 8,658,499 B2 | 2/2014 | Makala et al. | |
| 9,659,955 B1 | 5/2017 | Sharangpani et al. | |
| 9,960,045 B1 | 5/2018 | Purayath et al. | |
| 10,529,581 B2 * | 1/2020 | Hsu | H01L 27/11582 |
| 2010/0181610 A1 | 7/2010 | Kim et al. | |
| 2016/0181271 A1 * | 6/2016 | Yada | H01L 27/1157 438/264 |

(Continued)

*Primary Examiner* — Bradley Smith
(74) *Attorney, Agent, or Firm* — Moser Taboada; Alan Taboada

(57) ABSTRACT

Methods and apparatus for forming a plurality of nonvolatile memory cells are provided herein. The method includes depositing in a stack of alternating insulator layers and memory cell layers a layer of silicon oxide, a layer of silicon nitride, and a layer of amorphous silicon; removing the layer of amorphous silicon while maintaining the layer of amorphous silicon in a recess of the memory cells; selectively oxidizing the layer of amorphous silicon and the layer of silicon nitride to remove the layer of amorphous silicon from the recess and the layer of silicon nitride from the insulator layers; and removing oxidizing material from the recess and the insulator layers such that the layer of silicon nitride remains only in the recess of each memory cell of the memory cell layers and the layer of silicon oxide remains on both the insulator layers and the memory cell layers.

15 Claims, 4 Drawing Sheets

(56) References Cited

U.S. PATENT DOCUMENTS

| | | |
|---|---|---|
| 2016/0268283 A1 | 9/2016 | Kitamura et al. |
| 2017/0047340 A1* | 2/2017 | Huo .................... H01L 29/1037 |
| 2018/0254187 A1 | 9/2018 | Purayath et al. |
| 2018/0374863 A1 | 12/2018 | Purayath |
| 2020/0035700 A1* | 1/2020 | Xu .................... H01L 23/53257 |

* cited by examiner

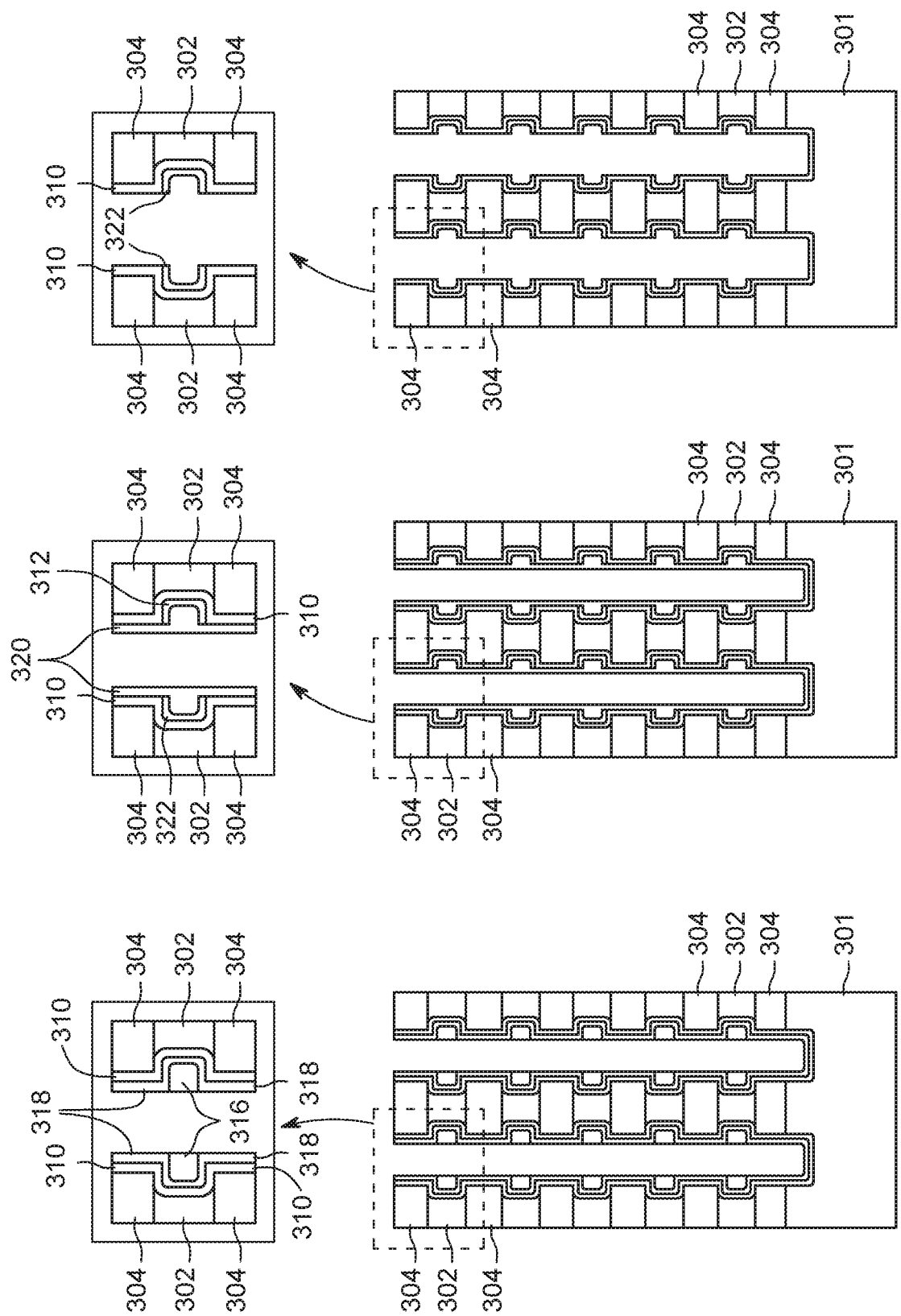

METHODS AND APPARATUS FOR THREE-DIMENSIONAL NAND STRUCTURE FABRICATION

CROSS REFERENCE TO RELATED APPLICATIONS

This application claims the benefit of and priority to U.S. Patent Application Ser. No. 62/791,262, which was filed on Jan. 11, 2019, the entire contents of which is incorporated herein by reference.

FIELD

Embodiments of the present disclosure generally relate to substrate processing equipment, and more particularly, to methods and apparatus for three dimensional (3D) NAND structure fabrication.

BACKGROUND

To address challenges encountered in scaling planar (2D) NAND memory devices to achieve higher densities at a lower cost per bit, ultra-high density, three-dimensional (3D) stacked memory structures have been introduced. Such 3D memory structures are sometimes referred to as having a Bit Cost Scalable (BiCS) architecture, and include strings of vertically aligned memory cells. Typically, the vertically aligned memory cells are formed from an array of alternating conductor and insulator layers, where the conductive layers correspond to the word lines of the memory structure.

As the number of vertically stacked memory cells in 3D NAND devices increases (e.g., as chip densities increase), the aspect ratio of memory cell strings also increases, introducing numerous manufacturing issues. The inventor has observed for example, as stacking increases, the difficulty in etching also increases, thus requiring a need to thin down layers in the stack to maintain the aspect ratio of the memory cell strings within manageable limits. However, the inventor has observed that thinning down the layers can undesirably lead to issues such as cross-talk among neighboring cells, leakage of trapped charges (e.g., in the charge trap region of the memory cell) in the memory cell strings, fringing effects, etc., which, in turn, can lead to poor device performance.

Accordingly, the inventor has provided methods and apparatus for 3D NAND structure fabrication.

SUMMARY

Methods and apparatus for forming a plurality of nonvolatile memory cells are provided herein. In some embodiments, the method includes depositing in a stack of alternating insulator layers and memory cell layers a layer of silicon oxide, a layer of silicon nitride atop the layer of silicon oxide, and a layer of amorphous silicon atop the layer of silicon nitride layer; removing the layer of amorphous silicon from the insulator layers while maintaining the layer of amorphous silicon in a recess of each memory cell of the memory cell layers; selectively oxidizing the layer of amorphous silicon and the layer of silicon nitride to remove the layer of amorphous silicon from the recess of each memory cell of the memory cell layers and the layer of silicon nitride from the insulator layers; and removing oxidizing material from the recess of each memory cell of the memory cell layers and the insulator layers such that the layer of silicon nitride remains only in the recess of each memory cell of the memory cell layers and the layer of silicon oxide remains on both the insulator layers and the memory cell layers.

In accordance with an aspect of the present disclosure, there is provided a system for forming a plurality of nonvolatile memory cells. The system includes an apparatus configured to deposit in a stack of alternating insulator layers and memory cell layers a layer of silicon oxide, a layer of silicon nitride atop the layer of silicon oxide, and a layer of amorphous silicon atop the layer of silicon nitride; an apparatus configured to remove the layer of amorphous silicon from the insulator layers while maintaining the layer of amorphous silicon in a recess of each memory cell of the memory cell layers and remove oxidizing material from the recess of each memory cell of the memory cell layers and the insulator layers; and an apparatus configured to selectively oxidize the layer of amorphous silicon and the layer of silicon nitride for removing the layer of amorphous silicon from the recess of each memory cell of the memory cell layers and the layer of silicon nitride from the insulator layers such that the layer of silicon nitride remains only in the recess of each memory cell of the memory cell layers and the layer of silicon oxide remains on both the insulator layers and the memory cell layers.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 3A-3G are schematic cross-sectional views of a portion of a 3D NAND memory device, in accordance with at least one embodiment of the present disclosure.

Figure 1:
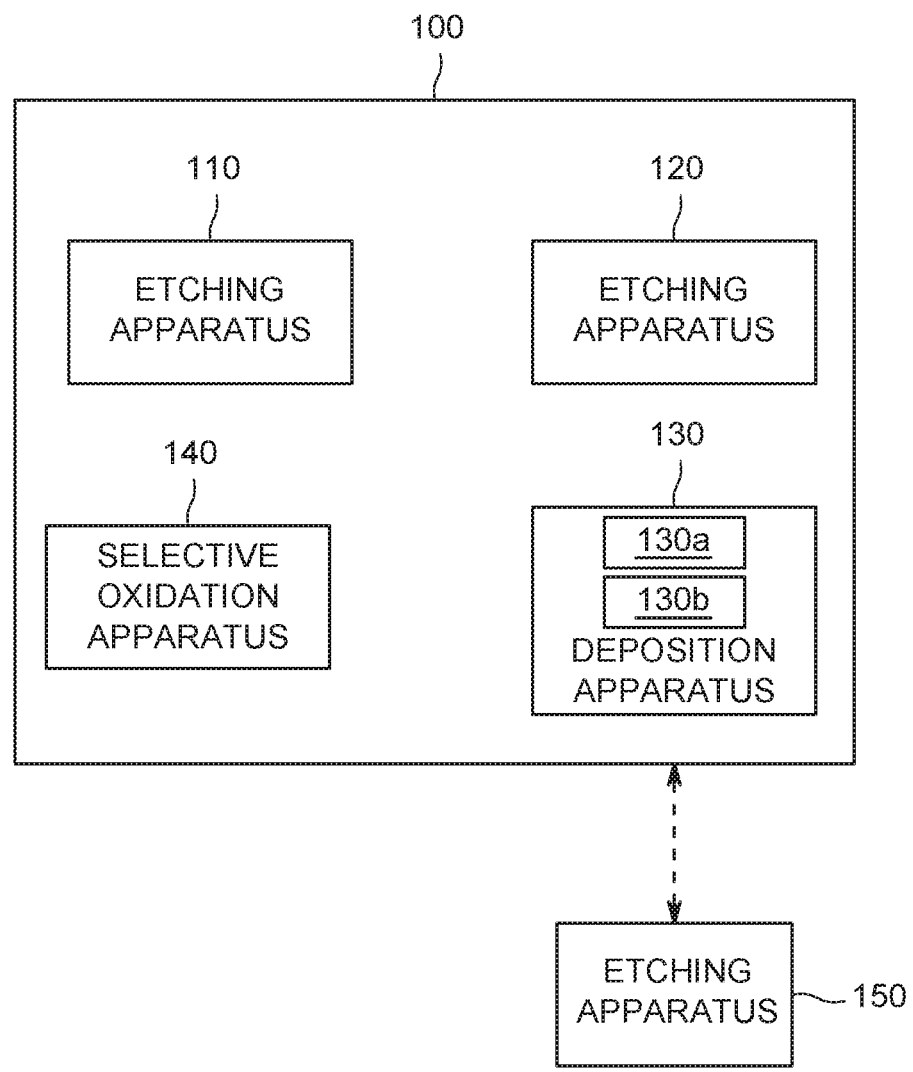
FIG. 1 is a schematic diagram of a system for forming a plurality of nonvolatile memory cells in a 3D NAND memory device, in accordance with at least one embodiment of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments described herein generally relate to 3D NAND memory devices with improved word-line isolation and methods of forming the same. Specifically, for each memory cell of a vertical NAND string, the charge trap region, which serves as the charge storage region of each memory cell, is formed as a separate charge trap. As a result, the charge trap of one memory cell is electrically isolated from adjacent charge traps in adjacent memory cells. Thus, a single charge trap layer that is adjacent to all memory cells in the vertical NAND string is not present. The charge trap of one memory cell is separated from the charge trap of adjacent memory cells by a dielectric structure, such as a silicon oxide film.

Figure 2:
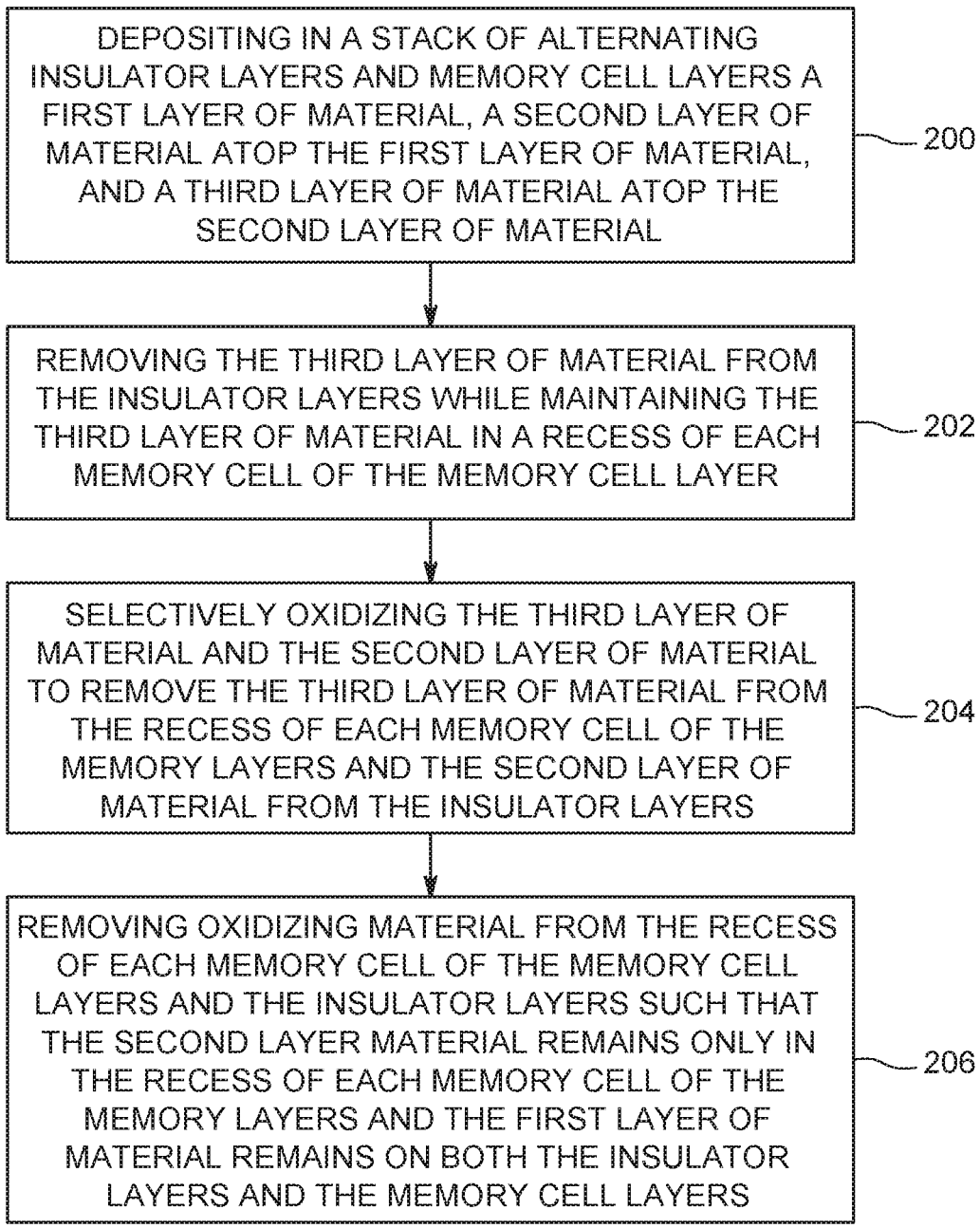
FIG. 2 is a flowchart of a method for forming a plurality of nonvolatile memory cells in a 3D NAND memory device, in accordance with at least one embodiment of the present disclosure.

FIG. 1 is a schematic diagram of a system 100 for forming a plurality of nonvolatile memory cells in a 3D NAND memory device (e.g., the memory device 300 of FIGS. 3A-3G) and FIG. 2 is a flowchart of a method for forming the plurality of nonvolatile memory cells in the memory device 300, according to an embodiment of the present disclosure.

Figure 3A:
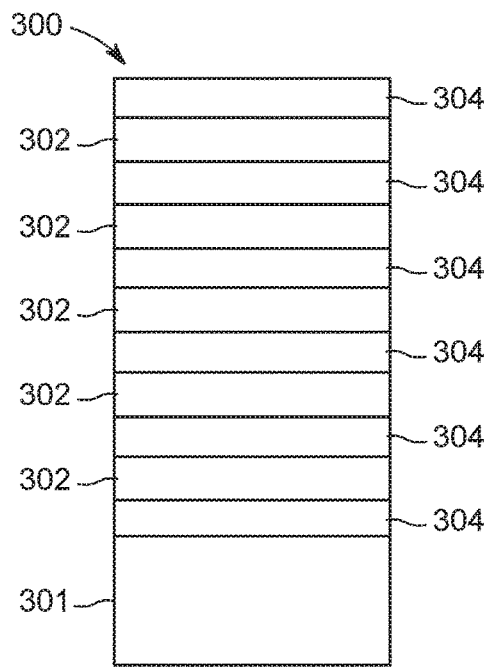

Prior to performing the method of FIG. 2 (e.g., prior to gate formation), one or more processes can first be performed on the memory device 300. For example, FIG. 3A shows the memory device 300, which can be a Bit Cost Scalable (BiCS) device, including a string (plurality) of vertically stacked memory cell layers 302 alternately disposed between a plurality of insulator layers 304, formed on a substrate 301, which in some embodiments can be a semiconductor.

The substrate 301 can be any suitable starting material for forming integrated circuits, such as a silicon (Si) wafer or a germanium (Ge) wafer. The substrate 301 may be a silicon semiconductor substrate having a layer or layers formed thereon, such as a film stack, employed to form a structure on substrate 301, such as the memory device 300. The substrate 301 may include a material such as crystalline silicon (e.g., Si<100> or Si<111>), silicon oxide, strained silicon, silicon germanium, doped or undoped polysilicon, doped or undoped silicon, patterned or non-patterned wafer, silicon on insulator (SOI), carbon-doped silicon oxides, silicon nitride, doped silicon, germanium, gallium arsenide, glass, sapphire, metal layers disposed on silicon, and the like. The substrate 301 may be configured as a 200 mm, 300 mm, or 450 mm diameter wafer, or as a rectangular or square panel.

Insulator layers 304 are disposed between and electrically isolate the memory cell layers 302. Insulator layers 304 may be any suitable electrically isolating material, such as silicon oxide. In some embodiments, the silicon oxide material can be a TEOS-formed silicon oxide material.

Each of the memory cell layers 302 corresponds to a word line of memory device 300, each word line extending into the page to form additional memory cells of the memory device 300 that are not visible. Thus, each memory cell layer 302 is configured to store one or more bits of data. As such, each memory cell layers 302 includes a charge trap region (e.g., a layer of silicon nitride (SiN, $Si_3N_4$, etc.) and a blocking oxide layer (e.g., a layer of SiO), described in greater detail below. The memory cell layers 302 can also include a control gate (not shown), which is formed after performing the method of FIG. 2. The charge trap region is the charge storage region of the memory cell of the memory cell layers 302 and can be formed from a portion of a charge trap layer that is ultimately separated into individual charge trap regions, one for each memory cell of the memory cell layers 302. The blocking oxide can include a material that prevents or reduces diffusion of metal atoms from the control gate into gate oxide and isolates the control gate from the charge trap region.

Figure 3B:
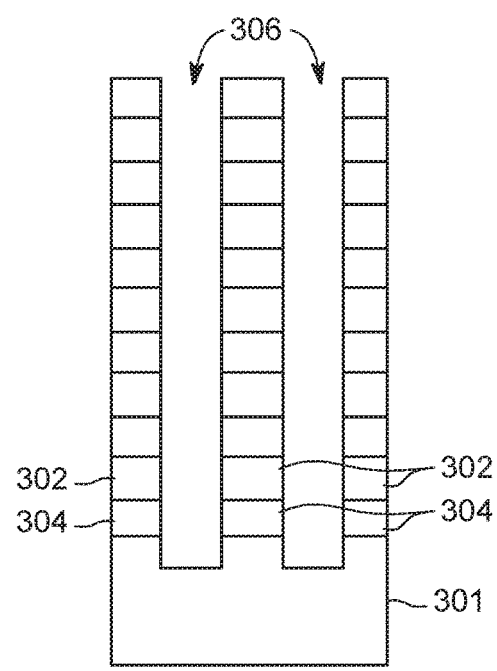

With reference to FIG. 3B, memory holes 306 are formed in the stack of alternating memory cell layers 302 and insulator layers 304 deposited on substrate 301. The string of memory cell layers 302 and insulator layers 304 are shown arranged with three vertical columns. Any suitable etching apparatus 110 (FIG. 1) and/or method may be employed to form the memory holes 306, such as deep reactive-ion etching (DRIE), a highly anisotropic etch process employed to create high aspect-ratio holes and trenches in wafers or other substrates. Other etching apparatus and/or processes can be used to form the memory holes 306.

Figure 3C:
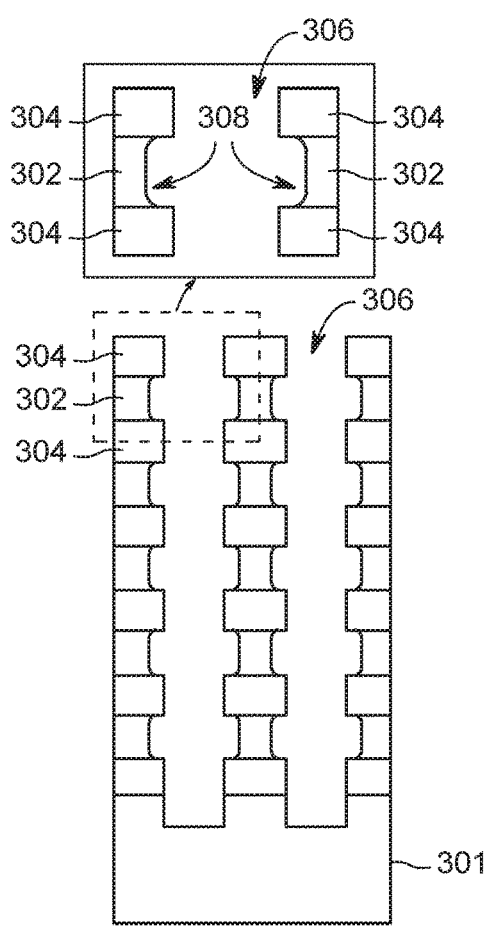

With reference to FIG. 3C, a nitride recess process is performed using an etching apparatus 120 to remove an exposed portion of memory cell layers 302 and form a recess 308 in each of memory cell of the memory cell layers 302. For illustrative purposes, an indicated area of detail including a part of the string of memory cell layers 302 (e.g., an individual memory cell) and insulator layers 304 (e.g., individual insulators) are shown (see FIG. 3C, for example). The nitride recess process can be performed on edge surfaces of insulator layers 304 and memory cell layers 302 that are exposed to memory holes 306. Generally, any isotropic etch process that is selective to at least the material of insulator layers 304 may be employed to remove a portion of memory cell layers 302 with high selectivity. For example, in some embodiments, a portion of memory cell layers 302 can be removed with a reactive species that is formed via a remote plasma from a process gas comprising oxygen ($O_2$) and nitrogen trifluoride ($NF_3$). Highly selective dry etching processes that may be used for the removal of the exposed portion of memory cell layers 302 are described in U.S. Pat. No. 9,165,786, entitled "Integrated oxide and nitride recess for better channel contact in 3D architectures" and filed Aug. 5, 2014. The dry etch process may be performed using, for example, the PRODUCER® SELECTRA™ line of etching apparatus (FIG. 1), available from Applied Materials, Inc., of Santa Clara, Calif.

The recess 308 can be configured to receive at least some of a layer of block oxide (e.g., a first layer 310 of SiO), a layer of charge trap material (e.g., a second layer 312 of SiN), and a third layer 314 of amorphous silicon ($\alpha$Si).

Figure 3D:
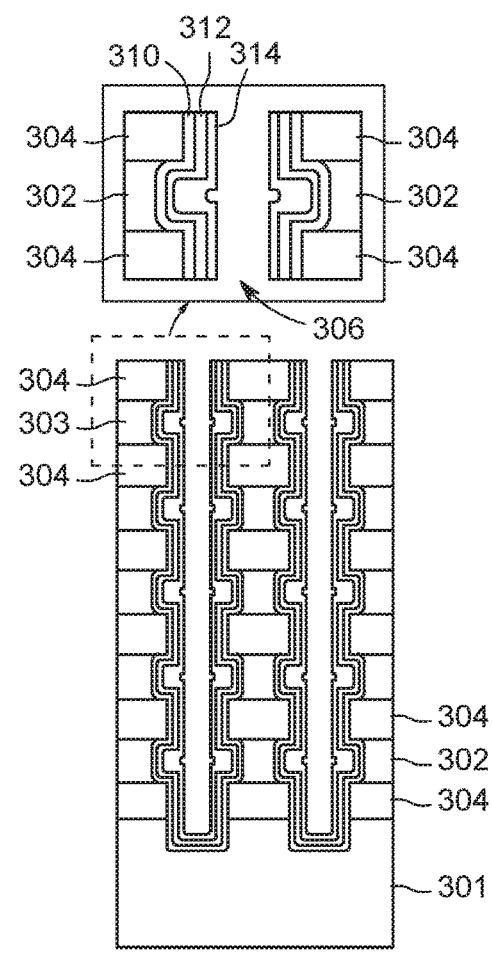

More particularly, and with reference to FIGS. 2 and 3D, at 200 the first layer 310 is deposited on the memory cell layers 302 including the recess 308 of each memory cell of the memory cell layers 302 and the insulator layers 304, with the second layer 312 being deposited atop the first layer 310, and the third layer 314 deposited atop the second layer 312. The first layer 310 and the second layer 312 may be deposited using any suitable deposition process and/or apparatus 130 (FIG. 1). For example, in some embodiments, the first layer 310 and the second layer 312 may be deposited using an atomic layer deposition (ALD) apparatus 130a, which can be a stand-alone apparatus (or a cluster tool) that is configured, for example, to perform an ALD process. One such apparatus can be, for example, the OLYMPIA™ line of ALD apparatus, available from Applied Materials, Inc. Chemical vapor deposition (CVD) can also be used to deposit the first layer 310 and the second layer 312.

Also, at 200 the third layer 314 can be deposited using the ALD apparatus 130a and/or process that was used for depositing the first layer 310 and the second layer 312. Alternatively or additionally, the third layer 314 can deposited using for example, a CVD apparatus 130b, which can be a stand-alone apparatus (or a cluster tool) that is configured, for example, to perform a CVD process. One such apparatus can be, for example, the PRODUCER® APF line of stand-alone CVD apparatus, available from Applied Materials, Inc.

Next, at 202 a portion of the third layer 314 is removed from the second layer 312. For example, the etch apparatus 120 used to perform the selective etch process described above for creating the recess 308 can also be used to remove a majority of the third layer 314 from the second layer 312, e.g., except for a portion 316 of the third layer 314 that remains within the recess 308 to cover or substantially cover the memory cell layers 302 (see indicated area of detail of FIG. 3E, for example). After the etch process at 202 is completed, the portion 316 that remains will be substantially flush with adjacent portions 318 of the second layer 312, e.g., portions 318 that extend along the insulator layers 304 and not covered by the portion 316 of the third layer 314.

Next, at 204 the portions 318 of the second layer 312 and the portion 316 of the third layer 314 are removed using a selective oxidation apparatus 140 (FIG. 1) configured to perform selective (or controlled) oxidation. For example, an oxide layer 320 may be by formed by oxidizing the portions 318 of the second layer 312 and the portion 316 of the third layer 314 (FIG. 3F), e.g., using rapid thermal oxidation (RTO), radical oxidation, or remote plasma oxidation (RPO), for example, decoupled plasma oxidation (DPO). In some embodiments, where a low thermal budget and/or reduced diffusion of oxygen are desired, plasma oxidation or radical oxidation may be utilized. As used herein, a low thermal budget means a thermal budget less than a furnace process of tens of minutes at 850 degrees Celsius peak temperature. For example, when RPO is used at 204, one or more suitable plasma reactors, such as RPO reactors available from Applied Materials, Inc. can be used to provide the oxide layer 320 on the portions 318 of the second layer 312 and the portion 316 of the third layer 314.

Alternatively, a high thermal budget processes (e.g., high oxygen diffusion) may also be utilized. For example, high thermal budget processes (e.g., wet, dry, or RTO) can provide conformal oxidation, faster oxidation rates, and thicker oxidation.

The type of selective oxidation apparatus 140 and/or process used to remove the portions 318 of the second layer 312 and the portion 316 of the third layer 314 can depend of the materials that are used for the first layer 310, the second layer 312, and/or the third layer 314, and/or one or more other factors, e.g., time constraints, desired oxidation rates, etc.

Regardless of the selective oxidation apparatus 140 and/or process used at 204, the selective oxidation process is carried out such that the oxide layer 320 reacts only with the portions 318 of the second layer 312 and the portion 316 of the third layer 314, e.g., a portion 322 disposed between first layer 310 and the portion 316 of the third layer 314 is not oxidized (or minimally oxidized) at 204. More particularly, during 204, selective oxidation process oxidizes all the portions 318 of the second layer 312 and a majority (if not all) of the portion 316 of the third layer 314, e.g., so that the portion 322 is not oxidized (or is minimally oxidized).

Next, at 206 the oxide layer 320 that is formed at 204 can be removed using, for example, a dry etching apparatus 150 to perform dry etching of the oxide layer 320. If any of portion of 316 remains in the recess (e.g., on portion 322), those portions 316 that remain are removed at 206. An example of the dry etching apparatus 150 is a SICONI™ available from Applied Materials, Inc. Alternatively, the etching apparatus 120 and/or process described above (at 202) can be used to remove the oxide layer 320.

After the oxide layer 320 is removed, the memory device 300 will have the stack of alternating memory cell layers 302 and insulator layers 304 covered by the original deposition of the first layer 310 and the recess 308 covered by the remaining portion 322 (e.g., the charge trap layer) of the second layer 312 (FIG. 3G). Once formed, the 3D NAND memory device 30 can be further processed to deposit a gate oxide layer, e.g., for gate formation.

The methods described herein can advantageously be used to form a 3D NAND memory device. For example, in a 3D NAND memory device as disclosed herein (e.g., memory device 300), cross-talk, e.g., leakage of trapped charges, among neighboring memory cells of the memory cell layers 302 of the memory device 300 is advantageously reduced, if not eliminated, by forming charge trap layers (e.g., the remaining portion 322 of the second layer 312) in the manner as disclosed herein Moreover, since the plurality of memory cells of the memory cell layers 302 including the recess 308 covered by the first layer 310 and the remaining portion 322 of the second layer 312 are formed prior to control gate formation, drawbacks associated with conventional methods (e.g., methods performed post gate formation) for reducing cross-talk among neighboring memory cells in 3D NAND memory device are overcome. For example, damage to the gate oxide, which can be caused by over etching the charge trap layer, which is used for forming the control gate, is reduced or eliminated. Metal contamination due to damage to the gate metal is also reduced or eliminated. Furthermore, the portion 316 of the third layer 314 protects the portion 322 of the second layer 312 (e.g., the charge trap region where the transistors are located) during the first selective etch process at 202 and, therefore, damage to the second layer 312 during the selective etch process at 202 can be reduced or avoided. The portion 316 also enables selective oxidation of the portions 318 (e.g., outside the gate area) while preventing oxidation of the portion 322 beneath the portion 316, thus reducing, if not eliminating the likelihood of damaging the charge trap region. And, since there is reduced or no variation in etch amount between the outer and inner memory holes 306, processing uniformity is advantageously increased.

While the foregoing is directed to embodiments of the present disclosure, other and further embodiments of the disclosure may be devised without departing from the basic scope thereof.

The invention claimed is:

1. A method for forming a plurality of nonvolatile memory cells, comprising:
    depositing in a stack of alternating insulator layers and memory cell layers a layer of silicon oxide, a layer of silicon nitride atop the layer of silicon oxide, and a layer of amorphous silicon atop the layer of silicon nitride;
    removing the layer of amorphous silicon from the insulator layers while maintaining the layer of amorphous silicon in a recess of each memory cell of the memory cell layers;
    selectively oxidizing the layer of amorphous silicon and the layer of silicon nitride to remove the layer of amorphous silicon from the recess of each memory cell of the memory cell layers and the layer of silicon nitride from the insulator layers; and
    removing oxidizing material, formed during selectively oxidizing the layer of amorphous silicon and the layer of silicon nitride, from the recess of each memory cell of the memory cell layers and the insulator layers such that the layer of silicon nitride remains only in the recess of each memory cell of the memory cell layers and the layer of silicon oxide remains on both the insulator layers and the memory cell layers.

2. The method of claim 1, wherein the recess of each memory cell of the memory cell layers is configured to receive at least some of the layer of silicon oxide, the layer of silicon nitride, and the layer of amorphous silicon.

3. The method of claim 1, wherein depositing the layer of silicon oxide and the layer of silicon nitride comprises performing atomic layer deposition.

4. The method of claim 1, wherein depositing the layer of amorphous silicon comprises performing chemical vapor deposition.

5. The method of claim 1, wherein removing the layer of amorphous silicon from the insulator layers comprises etching the layer of amorphous silicon.

6. The method of claim 1, wherein removing oxidizing material from the recess of each memory cell of the memory cell layers and the insulator layers comprises etching oxidizing material.

7. The method of claim 1, wherein selectively oxidizing comprises performing remote plasma oxidation on the layer of amorphous silicon and the layer of silicon nitride.

8. The method of claim 1, further comprising forming a gate oxide layer.

9. A system for forming a plurality of nonvolatile memory cells, the system comprising:
   an apparatus configured to deposit in a stack of alternating insulator layers and memory cell layers a layer of silicon oxide, a layer of silicon nitride atop the layer of silicon oxide, and a layer of amorphous silicon atop the layer of silicon nitride;
   an apparatus configured to remove the layer of amorphous silicon from the insulator layers while maintaining the layer of amorphous silicon in a recess of each memory cell of the memory cell layers and remove oxidizing material from the recess of each memory cell of the memory cell layers and the insulator layers; and
   an apparatus configured to selectively oxidize the layer of amorphous silicon and the layer of silicon nitride for removing the layer of amorphous silicon from the recess of each memory cell of the memory cell layers and the layer of silicon nitride from the insulator layers such that the layer of silicon nitride remains only in the recess of each memory cell of the memory cell layers and the layer of silicon oxide remains on both the insulator layers and the memory cell layers.

10. The system of claim 9, further comprising apparatus configured to form the recess of each memory cell of the memory cell layers such that the recess is configured to receive at least some of the layer of silicon oxide, the layer of silicon nitride, and the layer of amorphous silicon.

11. The system of claim 9, wherein the apparatus configured to deposit the layer of silicon oxide and the layer of silicon nitride is an atomic layer deposition apparatus.

12. The system of claim 9, wherein the apparatus configured to deposit the layer of amorphous silicon is a chemical vapor deposition apparatus.

13. The system of claim 9, wherein the apparatus configured to remove the layer of amorphous silicon and oxidizing material is an etching apparatus.

14. The system of claim 9, wherein the apparatus configured to selectively oxidize the layer of amorphous silicon and the layer of silicon nitride is a remote plasma oxidation apparatus.

15. The system of claim 9, further comprising apparatus configured to form a gate oxide layer.

\* \* \* \* \*